United States Patent

Burbidge et al.

[11] Patent Number: 6,101,200
[45] Date of Patent: Aug. 8, 2000

[54] LASER MODULE ALLOWING SIMULTANEOUS WAVELENGTH AND POWER CONTROL

[75] Inventors: Douglas S. Burbidge, Kanata; Daniel Gariepy, Quebec City, both of Canada

[73] Assignee: Nortel Networks Corporation, Montreal, Canada

[21] Appl. No.: 08/997,727

[22] Filed: Dec. 24, 1997

[51] Int. Cl.[7] .................................................. H01S 3/13
[52] U.S. Cl. ......................... 372/29; 372/32; 372/34; 372/38; 372/43
[58] Field of Search .................. 372/29, 32, 34, 372/38, 43

[56] References Cited

U.S. PATENT DOCUMENTS

| | | | |
|---|---|---|---|
| 4,815,081 | 3/1989 | Mahlein et al. | 372/32 |
| 4,821,273 | 4/1989 | Hori | 372/31 |
| 5,042,042 | 8/1991 | Hori et al. | 372/32 |
| 5,193,083 | 3/1993 | Yanagawa | 369/116 |
| 5,438,579 | 8/1995 | Eda et al. | 372/34 |
| 5,602,860 | 2/1997 | Masonson | 372/34 |
| 5,675,597 | 10/1997 | Shighara | 372/29 |
| 5,825,792 | 10/1998 | Villeneuve et al. | 372/32 |

OTHER PUBLICATIONS

Patent Abstracts of Japan, vol. 096, No. 005, May 31, 1996 & JP 08 018145 A (Olympus Optical Co Ltd), Jan. 19, 1996 *Abstract*.

Patent Abstracts of Japan, vol. 018, No. 351 (C–1220), Jul. 4, 1994 & JP 06 090672 a (Kyowa Hakko Kogyo Co Ltd), Apr. 5, 1994 *Abstract*.

Patent Abstracts of Japan, VO. 096, No. 006, Jun. 2, 1996 & JP 08 037334 A (NEC Corp.), Feb. 6, 1996 *Abstract*.

Patent Abstracts of Japan vol. 017, No. 434(E–1412) Aug. 11, 1993 (Aug. 11, 1993) –& JP 05 090672 A (Shimadzu Corp). Apr. 9, 1993 (Apr. 9, 1993) Abstract.

*Primary Examiner*—Hemang Sanghavi
*Assistant Examiner*—Benjamin H. Cushwa

[57] ABSTRACT

An apparatus for simultaneously stabilising the output power and wavelength of a semiconductor laser is disclosed. A wavelength discriminating scheme is used to provide a wavelength error signal and an output power detection scheme is used to provide an output power level signal. The wavelength error signal is used to adjust the behaviour of a temperature sensor such that an automatic temperature control (ATC) module configured to maintain a pre-determined output from the temperature sensor, adjusts the actual laser temperature to minimize said signal. The output power level signal is directly delivered to an automatic power control (APC) module, which adjusts the drive current fed into the laser to minimize said signal using known control circuitry means. Adjusting the properties of the temperature sensor makes it possible for the apparatus to manipulate laser temperature and current to achieve simultaneous power, wavelength and temperature control, using the constant-temperature and constant-power external control modules used by semiconductor lasers that do not stabilize wavelength.

20 Claims, 6 Drawing Sheets

LASER MODULE ALLOWING SIMULTANEOUS WAVELENGTH AND POWER CONTROL

FIELD OF THE INVENTION

This invention relates to a wavelength and output power stabilising apparatus for a semiconductor laser used in optical telecommunications switches.

BACKGROUND OF THE INVENTION

Semiconductor laser modules can be used as signal transmitters in communication systems. When used in this way, they are often operated in conjunction with external control loops which monitor and correct the wavelength and power of the output. Such loops rely on well-known relations that specify how the wavelength and power of the output can be controlled by varying the operating temperature of, and the drive current supplied to, the laser. Wavelength and power are thus stabilised in many lasers, using modules that are external to the laser module which implement the following types of control loops:

(1) an automatic temperature control (ATC) loop, which accepts a temperature level signal from the laser module and uses it to adjust the operating temperature of the laser to a desired level; and (2) an automatic power control (APC) loop, which accepts an output power level signal from the laser module and uses it to adjust the input drive current of the laser so that the output power is at a desired level.

Wavelength-error is not directly measured or regulated in many laser cards. Such measurements are omitted on the assumption that the proper functioning of the APC and ATC modules would, by providing control over power and temperature, also provide adequate control over wavelength in accordance with the relations alluded to above.

This assumption is justified when wavelength has to be controlled only to the extent required to prevent mode-hops from occurring. In recent years however, it has become desirable to control wavelengths more closely. More specifically, it has become desirable to upgrade existing laser modules to dense wavelength division multiplexing (DWDM) laser modules in fibre optic transmission systems. This operation of these modules requires reducing the wavelength spacing between channels, which in turn requires a greater degree of wavelength stabilisation than is available on systems that do not directly measure and correct wavelength errors. A control loop for measuring and controlling wavelength errors is necessary to implement support for DWDM. It also remains desirable to simultaneously maintain a control loop for measuring and controlling power.

There are known devices that simultaneously control both power and wavelength. They rely on an APC module that is modified to directly correct any fluctuations in wavelength error, as opposed to output power, by adjusting the drive current into the laser. They control temperature, as is done on pre-DWDM cards, using an ATC module. They minimise output power error by adjusting the temperature target of the ATC module. For examples, see U.S. Pat. No. 4,821,273 by Hori and issued on Apr. 11, 1989, and U.S. Pat. No. 5,042,042, by Hori at al. and issued on Aug. 20, 1991.

The drawback of this approach is that it requires a specialized temperature control circuit which is designed to use a wavelength error signal as its input, and therefore the implementation of wavelength control cannot be inserted into existing systems.

Another problem with this approach, is that it precludes normal operation of an APC module, which is always connected such that its input receives a power level signal, and its output drives a laser current.

A final problem with this approach is that it involves providing the wavelength monitoring apparatus, through the use of an optical splitter, with light from the front facet of the laser. This is problematic because it reduces the power-level of the signal reaching the fibre.

Therefore, existing control loops that simultaneously control wavelength and power, such as those described in U.S. Pat. Nos. 4,821,273 and 5,042,042, cannot be implemented on existing laser cards without affecting the implementation of the already existing APC and/or ATC modules. Since there are many pre-DWDM cards that only contain ATC and APC modules, it is desirable that the new DWDM laser modules be installed without requiring changes to the layout of the existing laser cards, or to the current implementations of the already existing ATC and APC modules. That is, it is desirable for the new wavelength control function to be internalised within the laser module, so as to not disturb the implementation of the already established APC and ATC modules.

SUMMARY OF THE INVENTION

It thus is an object of this invention to provide simultaneous power and wavelength-locking in a module that is compatible with pre-DWDM external control modules.

It is a further object of this invention to achieve this goal without requiring access to, or knowledge of, any of the external control modules already installed on the card.

These and other objects are achieved by a laser module for connection to an external automatic power control (APC) module and an external automatic temperature control module (ATC), the APC module being configured to adjust the laser drive current such that the laser output is locked onto a targeted optical power level, and the ATC module being configured to adjust the operating temperature of the laser such that it reaches a targeted temperature level, said laser module comprising: a semiconductor laser; a thermoelectric cooler (TEC) to effect upward or downward adjustment of the laser's temperature; first terminal means for connecting the thermoelectric cooler to an output of the ATC module; second terminal means for connecting the laser to a drive-current output of the APC module; means for generating an optical power level signal indicative of the power level of the laser output; means for generating a wavelength error signal indicative of the wavelength error of the laser output; third terminal means for communicating the optical power level signal to the APC module; means for deriving an apparent temperature level signal from the wavelength error signal; and fourth terminal means for communicating the apparent temperature level signal to the ATC module, such that the wavelength of the laser output is adjusted by varying the temperature of the laser until the apparent temperature level signal indicates that the given temperature level has been reached.

According to another aspect, the invention provides a system for simultaneously stabilising both wavelength and optical power of a semiconductor laser, comprising: means for monitoring the laser optical power and deriving an optical power level signal; means for adjusting the laser drive current in order to minimise the optical power level signal; means for monitoring the laser wavelength and deriving a wavelength error signal; a temperature sensor for sensing the laser temperature; a thermoelectric cooler to effect upward or downward adjustment of the laser temperature; a temperature control unit connected to the thermoelectric cooler and temperature sensor, and configured to maintain a pre-determined output from the temperature sensor; and means to cause the wavelength error signal to adjust the output properties of the temperature sensor such that the temperature control unit will adjust the actual laser temperature to maintain the original pre-determined output from the temperature sensor, and in so doing reduce the wavelength error signal.

According to another aspect, the invention provides a method of simultaneously stabilising the wavelength and power outputs of a semiconductor laser comprising the steps of: detecting an optical power level and generating an optical power level signal; delivering the optical power level signal to an automatic power control (APC) module, which adjusts the drive current fed into the laser to set the optical power level signal to a predetermined level; detecting a wavelength error and generating a wavelength error signal; and adjusting the behaviour of a temperature sensor using the wavelength error signal, such that an automatic temperature control (ATC) module configured to maintain a pre-determined output from the temperature sensor, adjusts the actual laser temperature to minimise the wavelength error signal.

BRIEF DESCRIPTION OF THE DRAWINGS

Embodiments of the invention will now be disclosed with reference to the accompanying drawings, in which.

DETAILED DESCRIPTION OF THE PREFERRED EMBODIMENTS

Figure 1:
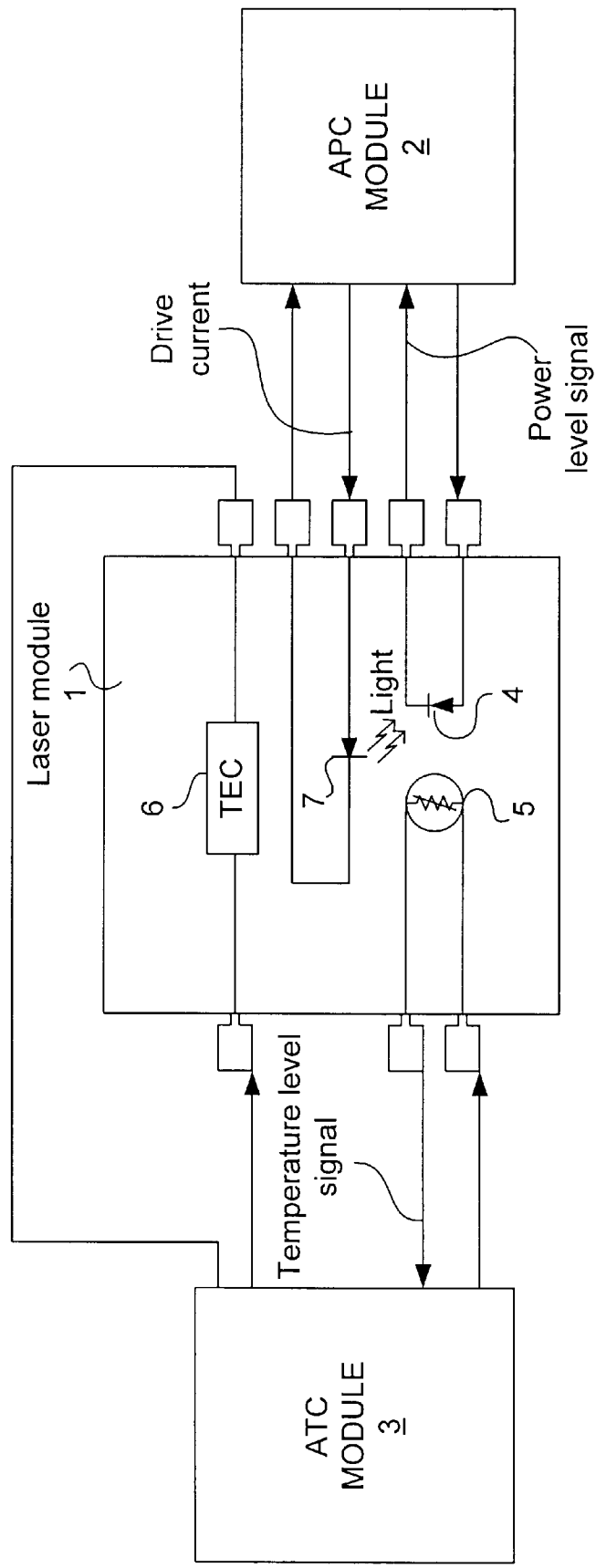
FIG. 1 is a high-level block-diagram of the interfaces between the laser module and the automatic temperature control (APC) and automatic power control (ATC) modules, where dense wavelength division multiplexing (DWDM) is not supported.

FIG. 1 illustrates three modules that would be found on a laser card that predates the implementation of a dense wavelength-division multiplexing (DWDM) function—a laser module 1, an automatic power control (APC) module 2 and an automatic temperature control (ATC) module 3. The laser module 1 contains a reverse biased PIN diode (PIN) 4, a negative temperature coefficient (NTC) thermistor 5, a thermoelectric cooler (TEC) 6 that can be operated in a heating or cooling mode, and a laser 7.

FIG. 1 illustrates the signals exchanged between the laser module 1, the APC module 2, and the ATC module 3 on a pre-DWDM card. The APC module 2 receives as input a back-facet monitor (BFM) current, hereinafter a power level signal. This signal is proportional to the power of the optical output of the laser 7; it is supplied by the reverse-biased PIN diode 4, which serves as a photodetector and is positioned to receive a portion of the back-facet light emitted from the laser 7. The APC module 2 generates as output a laser drive current that is adjusted to cause the optical power, as indicated by the photocurrent of the BFM PIN 4, to lock onto a given level. The APC module 2 requires two pin-outs to be connected to the PIN diode 4, and a further pin-out to adjust the laser current.

The ATC module 3 receives a temperature level signal as input. The ATC module 3 determines the temperature level by reading the voltage across the thermistor 5, which has a resistance that varies with temperature, and which is fed by a constant current source. The ATC module 3 reacts to changes in the voltage across the thermistor 5, which it interprets as changes in temperature, by varying the drive current for the TEC 6 so as to heat or cool the laser 7 until the voltage across the thermistor 5 reaches a desired level. The ATC module 3 requires from the laser module 1, two pin-outs for measuring temperature by measuring the voltage across the thermistor 5, and two pin-outs for sending current flows indicating required temperature changes to the TEC 6. Any DWDM (i.e. wavelength locking) laser module capable of being inserted into a pre-DWDM card must be capable of generating and receiving substantially similar signals as those generated and received by the laser module 1 of FIG. 1.

Figure 2:
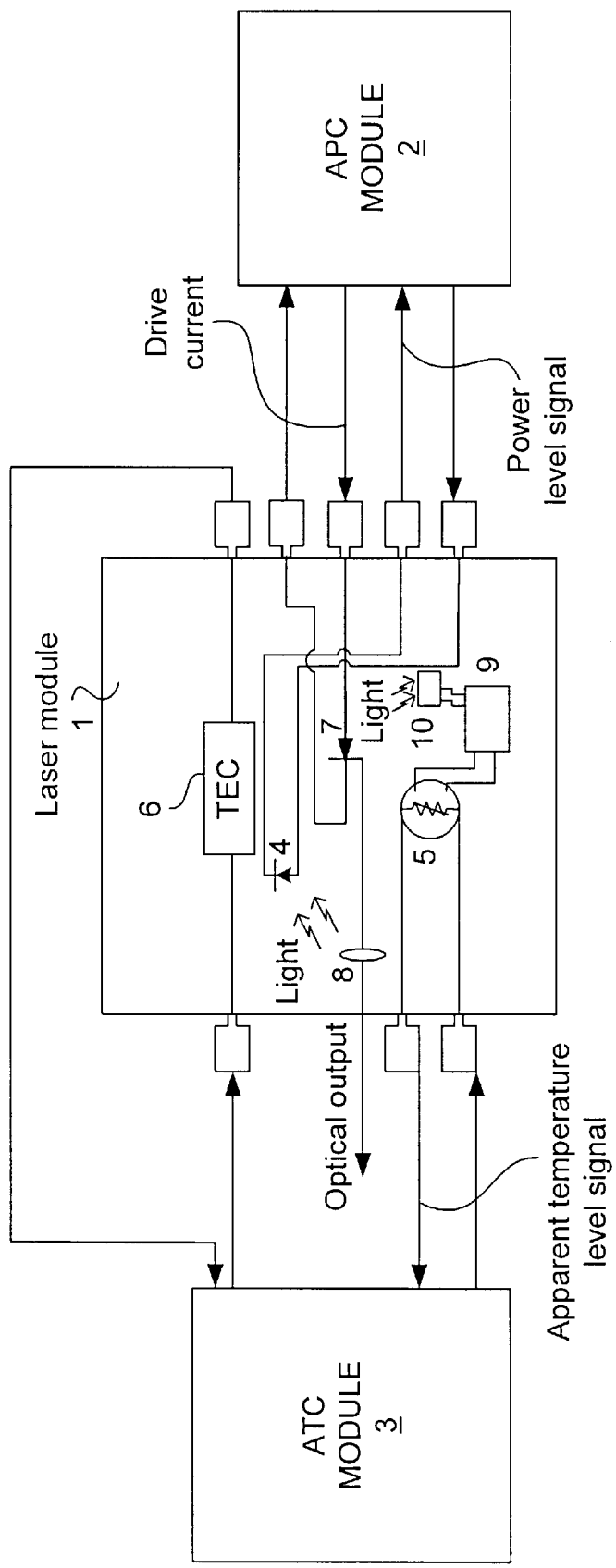
FIG. 2 is a high-level block-diagram of the interfaces between the DWDM laser module and the APC and ATC modules.

FIG. 2 illustrates how wavelength and power locking are implemented inside a DWDM laser module without having to effect any changes to the other modules on the card, according to a preferred embodiment of this invention. It contains the same modules seen in FIG. 1, with the exceptions that:

the BFM PIN 4 has been repositioned to a position from where it now receives light emerging from the front facet, as opposed to the back facet, of the laser 7. An optical splitter 8 has been added to direct part of the light emerging from the front facet of the laser 7 toward the relocated PIN 4.

an apparent temperature level (ATL) signal generator 9 and a wavelength discriminator 10 have been added. The wavelength discriminator 10 receives output light beams from the back facet of the laser 7 and processes them to generate two signals that collectively comprise a wavelength error signal, which it sends to the ATL signal generator 9. The ATL signal generator 9 uses the wavelength error signal to manipulate the thermistor 5, so that it generates an apparent temperature level signal for output to the ATC module 3.

It is to be noted that a wavelength error signal, as opposed to a wavelength level signal, is generated by the wavelength discriminator 10. This is done because neither the unaltered APC module 2 nor the unaltered ATC module 3 can know the value of the desired wavelength, neither being designed to lock wavelengths, and therefore neither can lock onto the desired wavelength given only a level signal.

The apparent temperature level signal generated by the laser module 1 of FIG. 2 is not to be confused with the temperature level signal that is generated by the laser module 1 of FIG. 1. The temperature level signal that is dispatched in FIG. 1 indicates to the ATC module 3 the actual operating temperature of the laser 7. The apparent temperature signal that is dispatched in FIG. 2 indicates to the ATC module 3, regardless of the actual temperature of the laser 7, that the temperature is being held constant as long as the wavelength of the optical output is held at some desired value, $\lambda_0$. If the wavelength strays from $\lambda_0$, the ATL signal generator 9 will cause the thermistor 5 to adjust the apparent temperature level signal so that the ATC module 3 believes that a temperature level change has occurred. The apparent temperature change reported by the ATL signal generator 9 is determined so as to cause a change in the actual operating temperature of the laser 7 that would cause the wavelength to be reset to $\lambda_0$. Therefore when the apparent temperature level signal is received, the ATC module 3, believing that a temperature change has in fact occurred, will cause the thermal output of the TEC 6 to change, such that the actual temperature of the laser 7 is adjusted until the wavelength of its optical output returns to $\lambda_0$.

FIG. 2 shows that the power level signal is fed into the APC module 2, as done in the pre-DWDM laser card of FIG. 1. FIG. 2 also indicates that the APC module 2 responds to the power level signal by correcting the drive current of the laser 7, as done on the pre-DWDM laser card of FIG. 1. The PIN 4 must be placed in a region where it can absorb sufficient light from the laser 7. It is important that the light used by the PIN 4 be unobstructed so that its current-drive current characteristics will be representative of the output power of the laser 7.

Since the ATC module 3 is used to effect wavelength locking, there is no equipment on the laser card of FIG. 2 that directly analyses temperature level signals. Nonetheless, indirect temperature stabilisation takes place on the laser card of FIG. 2 through the following mechanism. The APC module 2 continuously adjusts the laser current to lock the power at a desired level, thus affecting the laser temperature and ultimately the wavelength. The ATC module 3, which operates more slowly than the APC module 2 and thus takes as a given the drive current selected by the APC module 2, will be continuously adjusting temperature to lock into a given wavelength. Given an existing power level and a desired wavelength on which to lock, the ATC module 3 can only set the temperature at one possible value. Therefore, as long as wavelength and power are directly stabilised, the temperature will be sufficiently indirectly stabilised, at whatever temperature level is required in order for the optical output to have the desired power level and wavelength.

Figure 3:
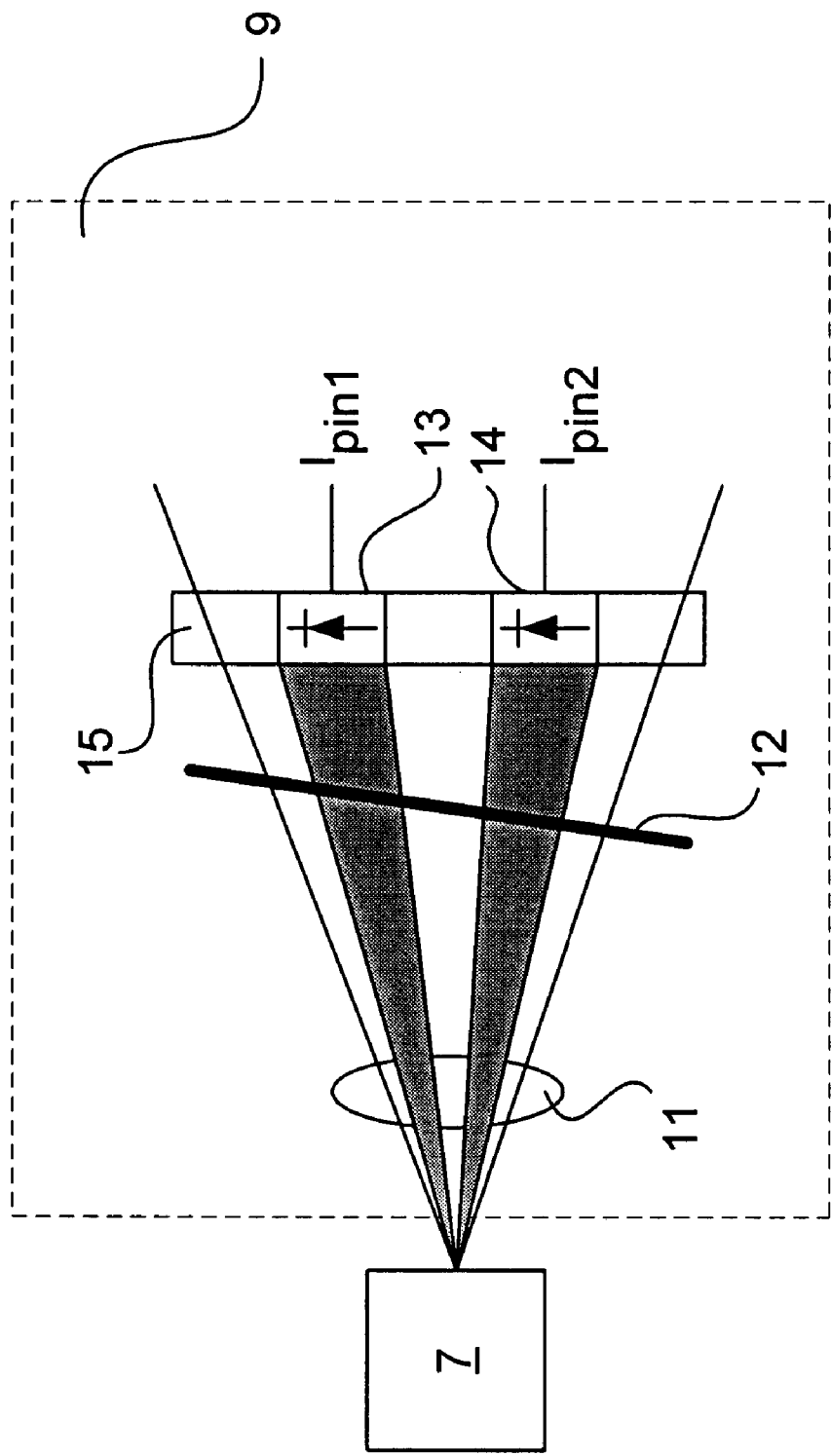
FIG. 3 illustrates a schematic diagram of a wavelength discriminator as disclosed in U.S. patent application Ser. No. 08/680,284, filed on Jul. 11, 1996, and assigned to the assignee of the present application.

FIG. 3 illustrates a detailed view of the wavelength discriminator 10, which is responsible for generating the wavelength error signal. It should be noted that this implementation of the wavelength discriminator 10 is described in detail in U.S. patent application Ser. No. 08/680,284, filed on Jul. 11, 1996, now U.S. Pat. No. 5,825,792 issued Oct. 20, 1998, and assigned to the assignee of the present application. The disclosure of U.S. Pat. No. 5,825,792 is incorporated herein by reference. In FIG. 3, an optional lens 11 controls the divergence of the output beam of the laser 7. The beam is passed from the lens 11 to a narrow bandpass wavelength selective transmission filter element 12. The filter element 12 is preferably a Fabry-Perot (FP) etalon, which is a structure comprising a spacer layer sandwiched between two highly reflecting layers. It is constructed for example as a multi-layer single cavity filter type, where an all-dielectric mirror/spacer/mirror structure is deposited on a glass substrate. Alternatively, a solid etalon type is used, in which mirrors are deposited on both sides of a glass spacer plate. Whichever implementation is used, the intensity of the beam that is allowed through the etalon 12 is a function of the wavelength of the beam sent to it.

The transmitted beam emerging from the etalon 12 is directed onto first and second similar coplanar photodetectors, PIN1 13 and PIN2 14, each having a specific diameter and separation and mounted on a common support 15 located at a specific distance from the FP etalon 12, as shown schematically in FIG. 3. Since a wavelength variation of the beam emerging from the laser 7 is converted to a transmission change by the etalon 12, the wavelength change of the laser beam is detected as a power change by the two photodetector PINs 13 and 14.

Figures 4, 5:
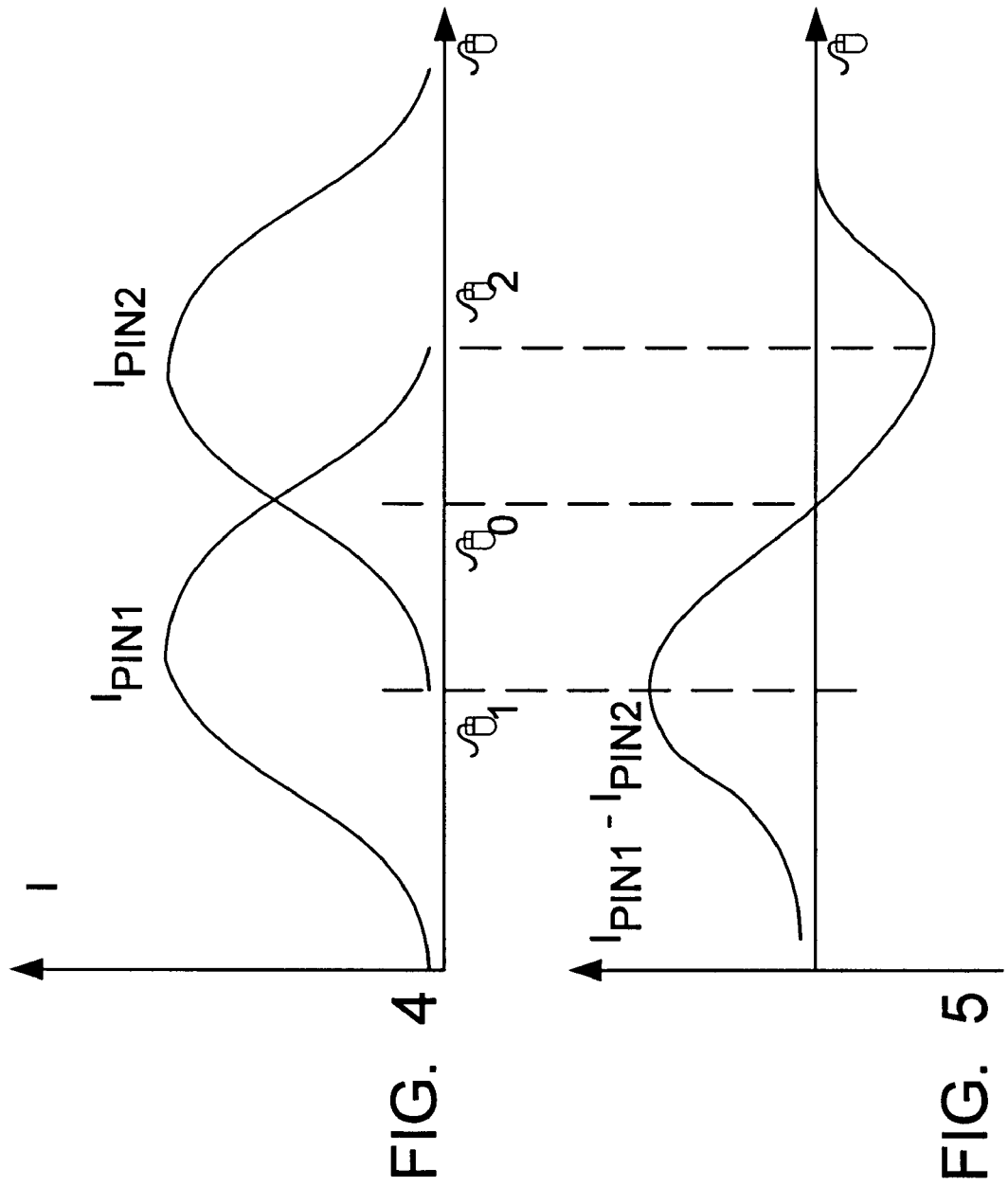
FIG. 4 illustrates a plot of the two PIN currents as a function of the wavelength of the laser, that are generated by the discriminator illustrated in FIG. 3.
FIG. 5 illustrates the corresponding difference signal between the two PIN currents illustrated in FIG. 4.

The PINs 13 and 14 are positioned such that one PIN has a peak intensity response at a slightly higher wavelength than the other PIN. The lower-wavelength PIN, PIN1 13, is referred to as the "blue PIN", while the upper-wavelength PIN, PIN2 14, is referred to as the "red PIN". FIG. 4 plots the transmission curves $I_{PIN1}$ and $I_{PIN2}$ that are respectively generated by the two PINs 13 and 14, as a function of the wavelength of the beam emitted by the laser 7. The differential signal obtained when subtracting $I_{PIN1}$ from $I_{PIN2}$ is illustrated in FIG. 5. The discriminator 10 is set up such that the wavelength at which the PIN currents are equal, $\lambda_0$, is considered the locked wavelength.

By arranging that the transmission detected by both PINs 13 and 14 is the same at $\lambda_0$, the differential signal can be set to zero at that predetermined locked wavelength. The differential signal can thus be used as the wavelength error signal. If the wavelength of the laser 7 changes so that it is no longer equal to $\lambda_0$, the differential signal generated by the two PINs 13 and 14, changes to a non-zero value. Thus, the difference between the PIN currents can be used as the wavelength error signal which in turn can indicate how the temperature of the laser 7 should be adjusted to bring the wavelength to $\lambda_0$. When $I_{PIN2} > I_{PIN1}$ the laser 7 is red-shifted, and a wavelength error signal is dispatched that eventually causes the apparent temperature level signal to rise. Since the thermistor 5 is an NTC thermistor, and since as a result, the ATC module 3 is designed to reduce actual temperature levels in response to reported increases in temperature, the rise of the apparent temperature level eventually causes the temperature to drop until the PIN currents are equal. When $I_{PIN1} > I_{PIN2}$ the laser 7 is blue-shifted, and a wavelength error signal is dispatched that eventually causes the apparent temperature level signal to drop, which in turn eventually causes the temperature to rise until the PIN currents are equal. When the pin currents are equal, the wavelength error signal is at zero, the laser module 1 is already successfully locked into the desired wavelength, $\lambda_0$, and no temperature or wavelength changes are effected.

It will be appreciated by those skilled in the art, that several other means of generating a wavelength error signal are available.

Once a wavelength error signal is generated, it must be converted into an apparent temperature level signal suitable for input into the ATC module 3. This involves setting the parameters of the signal (e.g. current, voltage) sent to the ATC module 3 from the thermistor 5 to values that are reflective of the wavelength error rather than the actual temperature of the laser 7.

Figure 6:
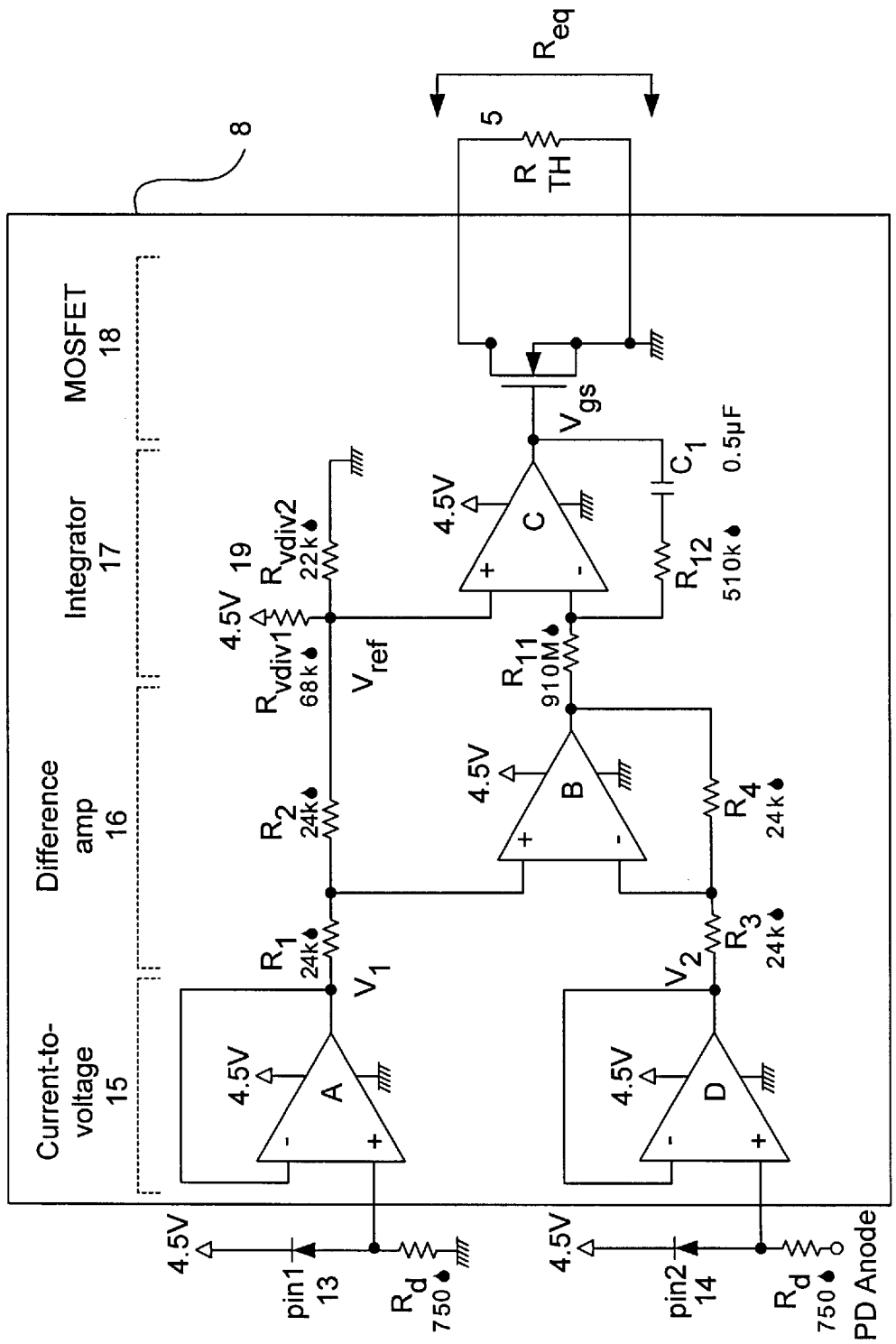
FIG. 6 illustrates a circuit schematic of an apparent temperature level (ATL) signal generator.

This "tricking" of the ATC module 3 is accomplished by the ATL signal generator 9 using the circuit design illustrated in FIG. 6. The ATL signal generator 9 comprises a current to voltage converter 15, a difference amplifier 16, an integrator 17 and an n-channel enhancement metal-oxide-semiconductor field-effect transistor (MOSFET) 18. A voltage divider 19 is adjacent to the difference amplifier 16 and the integrator 17. FIG. 6 also shows the two PINs 13, 14, that are part of the wavelength discriminator 10.

The current-to-voltage converter 15 is required since the difference amplifier 16 requires voltage at its inputs. The converter 15 has a standard design that is widely known. Selecting the resistor at the input stage ($R_d$) is based on the assumption that each PIN requires a bias greater than 1.25V to operate properly. It is also assumed that the maximum photocurrent from each PIN is 4 mA. A 750Ω resistor will provide over 1.25V bias in the condition of maximum photocurrent. A current to voltage converter 15 set-up in this manner will yield a voltage, $V_1$, that is directly related to the photocurrent of PIN1 13, and a voltage, $V_2$, that is directly related to the photocurrent of PIN2 14.

Once the photocurrents have been converted into voltages by the current-to-voltage converter 15, the difference amplifier 16 calculates the difference between the voltages, and by extension, the differences between the photocurrents of the PINs 13, 14. The difference amplifier 16 takes the two voltage inputs and gives an output according to:

$$V_o = V_{ref} + V_2\left(\frac{R_1}{R_4} \frac{R_1 + R_2}{R_3 + R_4}\right) - V_1\left(\frac{R_2}{R_1}\right)$$

It is important that both input resistors, R1 and R3, have the same values. When $R_1=R_2=R_3=R_4$, the output of the amplifier 16 is $V_o=V_{ref}+(V_2-V_1)$ The wavelength is considered locked when $V_1=V_2$, or when $V_o=V_{ref}$.

The reference voltage, $V_{ref}$, is set using the voltage divider 19. It is important to set $V_{ref}>0$ for the control loop to operate properly.

The integrator 17 is the next stage in the ATL signal generator 9. The purpose of the integrator 17 is to minimise the steady-state error. The values of a capacitor, $C_i$, and resistors, $R_{i1}$ and $R_{i2}$, in the integrator 17, are to be selected using known methods, so as to attain the fastest response while reducing oscillation. The reference voltage for the integrator 17 is set by the same voltage divider 19 used by the difference amplifier 16, in light of the same start-up considerations described above.

The output of the integrator 17 is fed to the gate of the MOSFET 18. The MOSFET 18 converts the output of the integrator 17, into an apparent temperature level signal that is reflective of the wavelength error. This "tricking" of the ATC module 3 is accomplished in the following way. The MOSFET 18 has its drain and source connected in parallel to the thermistor 5. The source and substrate are grounded and connected to the ground lead of the thermistor 5 as shown in FIG. 6. By connecting the MOSFET 18 to the thermistor 5 in this way, instead of allowing the resistance seen by the ATC module 3, $R_{eq}$, to vary solely according to the resistance of the thermistor, $R_{th}$, $R_{eq}$ is made to vary according to the discrepancy between the actual wavelength of the laser 7 output, and a desired wavelength, $\lambda_o$.

More specifically, $R_{eq}$ can be varied by varying not only the resistance of the thermistor 5, $R_{th}$, but also by varying the forward transconductance, $R_{ds}$, of the MOSFET 18. $R_{ds}$ can be varied by feeding the output of the integrator 17, $V_o$, which is related to the wavelength error signal, into the gate of the MOSFET 18. When this is done, because $R_{ds}$ varies with its gate-source voltage, which is related to $V_O$, and because the control loop of the integrator 17 continues to adjust $V_o$ until the input voltages $V_1$ and $V_2$ are equal, $R_{eq}$ becomes a function of the discrepancy between $V_1$ and $V_2$. This discrepancy, as described earlier, is proportional to the wavelength error signal, which means that $R_{eq}$ as seen by the ATC module 3 is adjusted until the wavelength error signal disappears (i.e. until the wavelength of the laser 7 is at the desired level, $\lambda_0$). In this way, an apparent temperature level signal that is in fact related to a wavelength error signal, is communicated to the ATC module 3. It should be noted that the MOSFET 18 sinks less than a nanoamp of current at the gate, making it ideal for this type of low power application.

Many secondary design considerations must be kept in mind aside from those related to generating input signals for the ATC and APC modules. For example, it is desirable to have a high $R_{ds(off)}$ such that $R_{eq}$ equals $R_{th}$ when the system is powering-up. The temperature control loop would thus initially sense only $R_{th}$ when powering-up, and set the laser temperature at an appropriate operating level. As the laser 7 begins to output more power, the wavelength control loop will be able to use the PIN currents to operate and $R_{eq}$ will become a function of the wavelength error and not be simply equal to $R_{th}$.

Additionally, one of the main restrictions imposed upon the design of the circuit as a result of the requirement that it be able to interface with the pre-DWDM ATC and APC modules 2, 3, is that its only source of power is a single-supply voltage used to reverse-bias the two PINs 13, 14. Accordingly, the circuit must operate within the range of 0V to 4.5V and still provide dynamic feedback response. Since the output of the wavelength control loop will be between 0V and 4.5V in this embodiment, an n-channel MOSFET is required. In order to also provide a high $r_{ds(off)}$, for start-up purposes as described above, the MOSFET 18 will have to be enhancement-mode.

Another secondary design consideration to bear in mind, if the thermistor 5 has a negative temperature coefficient as is standard in the art, is that the apparent temperatures reported by the laser module 1 will be limited to temperatures higher than a pre-set substrate temperature, $T_s$, to which the laser module 1 locks when the MOSFET 18 is off. $T_s$ should be set with this limitation in mind.

Figure 7:
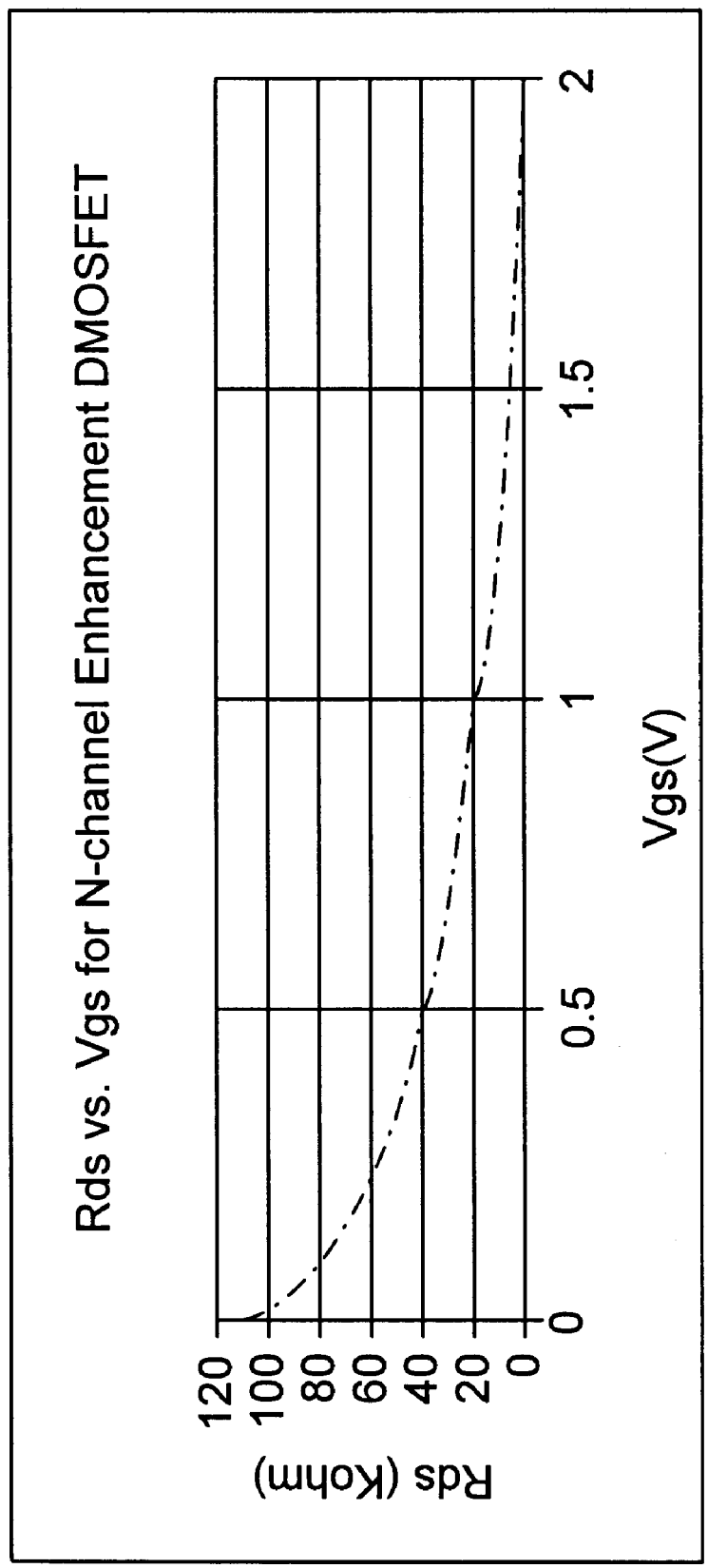
FIG. 7 illustrates a plot of $R_{ds}$ vs $V_{gs}$ for an n-channel enhancement metal-oxide semiconductor field-effect transistor (MOSFET).

Another secondary design consideration particular to the described embodiment of this invention, stems from the non-linear relationship between the gate-source voltage and $R_{ds}$, which is illustrated in FIG. 7. In wavelength locking with the MOSFET 18 in parallel with the thermistor 5, $R_{ds}$ eventually settles at an appropriate value to lock the wavelength for a fixed power and temperature setting. Thus the gate-source voltage, also settles at a particular value since $R_{ds}$ is dependent on it. The non-linear relationship of $R_{ds}$ on the gate-source voltage means that the locking loops will respond differently for different gate-source voltage locking values, and by extension, for different $\lambda_0$ locking-values.

Several advantages are realized by the laser card described by FIGS. 2 through 6 collectively. The card will be able to simultaneously lock wavelength and power to desired levels, using existing ATC modules and APC modules designed for pre-DWDM cards, without requiring changes to, special access to, or knowledge of either set of modules, over the remaining life of the laser card. The only access to the ATC module 3 required by the new wavelength-locking card, occurs through the already existing pin-outs of the thermistor 5. The APC module 2 is accessed exactly as it is accessed in the pre-DWDM card. Both modules can thus perform in their normal modes of operation that predate the DWDM card. This minimises disruption to the APC module 2 and the ATC module 3.

It is to be noted that as the wavelength of the output of the laser card drifts away from $\lambda_0$ due to aging, independently of external factors such as temperature and power changes, the laser card self-corrects the wavelength.

It is to be noted that placing the MOSFET 18 in parallel with the thermistor 5 provides a safeguard in the event that any part of the control loop, including the MOSFET 18, fails. If the MOSFET 18 goes into the off state or becomes an open circuit, then $R_{eq}$ equals $R_{th}$, and the temperature control loop will set the laser temperature to $T_s$. As long as $T_s$ is within a range of operating temperatures for the laser 7, then the worst outcome would be a loss of the wavelength locking function.

Numerous modifications and variations of the present invention are possible in light of the above teachings. It is therefore to be understood that within the scope of the appended claims, the invention may be practised otherwise than as specifically described herein.

In one variation, a temperature sensor other than a thermistor can be employed.

In another alternative embodiment of the invention, a wavelength discriminator 10 of FIG. 3 can also be used to generate, in addition to the wavelength error signal for the pre-DWDM ATC module 3, the optical power level signal for the pre-DWDM APC module 2. This involves generating a BFM current that will allow the APC module 2 to monitor the optical power of the laser 7, from the PIN2 14 used by the discriminator 10. This is possible because the beams passing through the etalon 12, and therefore the currents emerging from the two PINs 13 and 14, are not only functions of the wavelength of the beams emerging from the laser 7, but also a function of the power of those beams.

Accurately monitoring the optical power using PIN2 14 requires consideration of the effect of the wavelength locking features of the wavelength discriminator 10, on the power locking operation. Typical relationships between the output current of the PINs 13, 14, are illustrated in FIG. 4. They show that the PIN currents are neither linearly nor directly related to the power intensity of the laser output over all values of the wavelength, due to the effects of wavelength discrimination by the etalon 12. An APC module 2 that is using the PIN currents generated by the wavelength discriminator 10 must rely only on readings taken when the PIN2 14 is operating in a region where the photocurrent response is varying monotonically with the laser drive current (i.e. between $\lambda_1$ and $\lambda_2$). When the wavelength is in this range, PIN2 14 yields a photocurrent that varies linearly with changes in output power. The PIN2 14 as opposed to the PIN 1 13 is used to generate a power level signal in a preferred embodiment, since the PIN 2 14 yields photocurrents that vary directly with the detected power level as expected by the traditional APC module 2. In the case of the wavelength discriminator 10 illustrated in FIG. 3 and with outputs illustrated in FIG. 4 for example, the PIN2 14, always has a positive slope in the desired region of the PIN current-wavelength curve extending between $\lambda_1$ and $\lambda_2$, and so should be designated to be the source of the optical power level signal on the laser card.

It will be appreciated by those skilled in the art, that though a more difficult implementation results, it is also possible for the APC module 2 to use the photocurrent of the PIN1 13 for power control.

Even if the technical limitations just described are overcome, under this alternative embodiment, the PIN used to interface with the APC module 2 will no longer behave exactly like a traditional BFM PIN such as the PIN 4 deployed in FIG. 1. This means that some knowledge of the implementation of the APC module 2 is required to implement this embodiment. Moreover, the dynamic range of the power and wavelength locking loops would decrease.

Of course, the advantages gained by using one of the two PINs 13, 14 on the wavelength discriminator 10 as an optical power-level PIN, relate to not having to find space on the laser module 1 for the repositioned PIN 4, and not having to incur the costs of including the repositioned PIN 4 and the splitter 8, both of FIG. 2. Using only the PINs 13, 14 of the wavelength discriminator 10 also means that no tap is used to divert light emerging from the front-facet of the laser 7, which in turn means that the optical power-level reaching the fibre is not reduced. Having regard to these advantages, this alternative embodiment should not be excluded from the scope of the attached claims.

In another embodiment, the way to fool the ATC module 3 into regulating wavelength, besides placing a MOSFET 18 in parallel with the thermistor 5, is to remove the thermistor 5 altogether and have only a MOSFET 18 or some other voltage-controlled-resistor in the place of the thermistor 5. The danger that must be considered with this arrangement, is that of overheating occurring during start-up if the ATC module 3 were to see the sort of large $R_{eq}$ it would see if it was directly connected to a MOSFET 18 that is in the off state.

Another way to vary $R_{eq}$ with wavelength error is by placing the MOSFET 18 in series with the thermistor 5. Though this arrangement can be used, it has three problems. Firstly, the range of the wavelength control loop will be limited partly by the minimum $R_{ds}$ of the FET. Secondly, over heating of the laser 7 will result whenever the temperature control loop is activated since whenever the FET becomes an open circuit, $R_{eq}$ will go high and the temperature control loop will think the substrate temperature is extremely low. Thirdly, the gate-source voltage of the MOSFET 18 will have a very small range which limits the range of operation of the locking loop.

It also is possible to vary Req by placing some means of wavelength-dependent thermal control over the thermistor 5. This allows variation of $R_{th}$ based on heat flow into or out of the thermistor 5. However, there are several disadvantages to this technique which makes it inferior to those previously described. Firstly, it would require much more power than any other method described herein. Secondly, time-response would be much slower due to the increased dependence on heat flow. Finally, if the heat flow to the thermistor 5 is controlled by placing another TEC directly adjacent to it, a small and costly component, or alternatively, a bulky component requiring significant redesign of the laser module 1, would be required.

Further variations other than those described above are possible.

We claim:

1. A laser module for connection to an external automatic power control (APC) module and an external automatic temperature control module (ATC), the APC module being configured to adjust the laser drive current such that the laser output is locked onto a targeted optical power level, and the ATC module being configured to adjust the operating temperature of the laser such that it reaches a targeted temperature level, said laser module comprising:

a semiconductor laser;

a thermoelectric cooler (TEC) to effect upward or downward adjustment of the laser's temperature;

first terminal means for connecting the thermoelectric cooler to an output of the ATC module;

second terminal means for connecting the laser to a drive-current output of the APC module;

means for generating an optical power level signal indicative of the optical power level of the laser output;

means for generating a wavelength error signal indicative of the wavelength error of the laser output;

third terminal means for communicating the optical power level signal to the APC module;

means for deriving an apparent temperature level signal from the wavelength error signal; and fourth terminal means for communicating the apparent temperature level signal to the ATC module;

such that the wavelength of the laser output is adjusted by varying the temperature of the laser until the apparent temperature level signal indicates that the given temperature level has been reached.

2. A laser module according to claim 1 wherein the means for deriving the apparent temperature level signal, comprises a variable resistance.

3. A laser module according to claim 2 wherein the variable resistance comprises a thermistor, and a second TEC that is controlled by the wavelength error signal, and wherein the second TEC is used to control the resistance-value of the thermistor by creating a temperature difference between the laser and the thermistor.

4. A laser module according to claim 3 wherein the second TEC is placed in contact with or in the vicinity of the thermistor.

5. A laser module according to claim 4 wherein the second TEC is integrated monolithically with the thermistor.

6. A laser module according to claim 2 wherein the variable resistance comprises a controllable resistance whose resistance-value is controlled by the wavelength error signal, and a thermistor set up in parallel with the controllable resistance, such that the adjustments effected by the wavelength error signal to the controllable resistance determine the combined equivalent resistance-value of the controllable resistance and the thermistor.

7. A laser module according to claim 6 wherein the controllable resistance comprises a metal-oxide semiconductor field-effect transistor (MOSFET), wherein the wavelength error signal is applied to the gate of the MOSFET, and wherein the thermistor is connected in parallel to the drain and source of the MOSFET.

8. A laser module according to claim 2 wherein the variable resistance comprises a controllable resistance whose resistance-value is controlled by the wavelength error signal, and a thermistor set up in series with the controllable resistance, such that the adjustments effected by the wavelength error signal to the controllable resistance determine the combined equivalent resistance-value of the controllable resistance and the thermistor.

9. A laser module according to claim 8 wherein the controllable resistance comprises a metal-oxide semiconductor field-effect transistor (MOSFET), wherein the wavelength error signal is applied to the gate of the MOSFET, and wherein the thermistor is connected in series to the drain or source of the MOSFET.

10. A laser module according to claim 2 wherein the variable resistance comprises a controllable resistance whose resistance-value is controlled by the wavelength error signal.

11. A laser module according to claim 10 wherein the controllable resistance comprises a metal-oxide semiconductor field-effect transistor (MOSFET), and wherein the wavelength error signal is applied to the gate of the MOSFET.

12. A laser module according to claim 1 wherein the means for generating a wavelength error signal indicative of the wavelength error of the laser output comprises two optical detectors arranged in relation to wavelength discriminating elements such that their spectral responses are different, and such that a difference signal generated by them can be used to indicate the wavelength error signal.

13. A laser module according to claim 1 wherein the means for generating an optical power level signal indicative of the power level of the laser output comprises an optical detector which is separate from the means for generating the wavelength error signal.

14. A laser module according to claim 12 wherein the means for generating an optical power level signal indicative of the power level of the laser output comprises one of the two optical detectors used for generating the wavelength error signal.

15. A laser module according to claim 14 wherein the two optical detectors sense light emerging from the back facet of the laser.

16. A system for simultaneously stabilising both wavelength and optical power of a semiconductor laser, comprising:

means for monitoring the laser optical power and deriving an optical power level signal;

means for adjusting the laser drive current in order to set the optical power level signal to a targeted optical power level;

means for monitoring the laser wavelength and deriving a wavelength error signal;

a temperature sensor for sensing the laser temperature;

a thermoelectric cooler to effect upward or downward adjustment of the laser temperature;

a temperature control unit connected to the thermoelectric cooler and temperature sensor, and configured to maintain a pre-determined output from the temperature sensor; and means to cause the wavelength error signal to adjust the output properties of the temperature sensor such that the temperature control unit will adjust the actual laser temperature to maintain the original pre-determined output from the temperature sensor, and in so doing reduce the wavelength error signal.

17. A method of simultaneously stabilising the wavelength and power outputs of a semiconductor laser comprising the steps of:

detecting an optical power level and generating an optical power level signal;

delivering the optical power level signal to an automatic power control (APC) module, which adjusts the drive current fed into the laser to set the optical power level signal to a targeted level;

detecting a wavelength error and generating a wavelength error signal; and adjusting the behaviour of a temperature sensor using the wavelength error signal, such that an automatic temperature control (ATC) module configured to maintain a predetermined output from the temperature sensor, adjusts the actual laser temperature to minimise the wavelength error signal.

18. The method of claim 17 wherein the temperature sensor is a thermistor and wherein the step of adjusting the behaviour of a temperature sensor comprises the step of varying the equivalent resistance-value of the thermistor as seen by the ATC module, in accordance with fluctuations in the wavelength error signal.

19. The method of claim 18 wherein the step of varying the equivalent resistance-value of the thermistor as seen by the ATC module, comprises the step of feeding the wavelength error signal into the gate of a field-effect transistor (FET) that is connected in parallel to the thermistor.

20. The method of claim 18 wherein the step of varying the equivalent resistance-value of the thermistor as seen by the ATC module, comprises the step of using a second TEC whose thermal output fluctuates in accordance with the wavelength error signal, to control the resistance-value of the thermistor by creating a temperature difference between the laser and the thermistor.

* * * * *